United States Patent [19]

Fickes et al.

[11] Patent Number: 4,478,931
[45] Date of Patent: Oct. 23, 1984

[54] PRECURLED FLEXOGRAPHIC PRINTING PLATE

[75] Inventors: Michael G. Fickes, Colts Neck; Alan L. Shobert, Old Bridge, both of N.J.

[73] Assignee: E. I. Du Pont de Nemours and Company, Wilmington, Del.

[21] Appl. No.: 424,473

[22] Filed: Sep. 27, 1982

[51] Int. Cl.$^3$ .............................................. G03F 7/00
[52] U.S. Cl. .................................... 430/309; 430/286; 430/288; 430/300; 430/302; 430/328; 430/329; 101/401.1
[58] Field of Search .............. 430/300, 309, 328, 286, 430/288, 329, 302; 101/401.1, 375

[56] References Cited

U.S. PATENT DOCUMENTS

| | | | |
|---|---|---|---|
| 4,177,074 | 12/1979 | Proskow | 430/286 |
| 4,298,680 | 11/1981 | Bruno | 430/300 |
| 4,323,637 | 4/1982 | Chen et al. | 430/271 |
| 4,381,961 | 5/1983 | van der Velden | 156/215 |

Primary Examiner—John E. Kittle
Assistant Examiner—José G. Dees

[57] ABSTRACT

A permanent curl is provided in flexographic printing plates comprising a flexible sheet support and a photosensitive layer of a photopolymerizable elastomeric composition having a dry thickness of about 0.005 to 0.250 inch wherein after liquid development the printing plate is dried, 20° to 80° C. for at least 0.25 hour, and is postexposed by overall actinic radiation exposure for 1 to 30 minutes, at least the postexposure occurring while the printing plate is present on a curved surface, e.g., a printing cylinder. The process is useful for rubber and block copolymer-containing printing plates.

8 Claims, 1 Drawing Figure

PRECURLED FLEXOGRAPHIC PRINTING PLATE

DESCRIPTION

1. Technical Field

This invention relates to a process for providing a curl in flexographic printing plates. More particularly this invention relates to a process for providing a curl in photosensitive printing plates having solvent-insoluble, elastomeric printing reliefs.

2. Background Art

Photosensitive flexographic printing plates are becoming more important in the printing trade. The printing plates are useful for letterpress printing of packaging materials, e.g., cardboard, plastic films, etc. Particularly useful compositions for preparing such flexographic printing plates include: compositions containing addition-polymerizable, ethylenically unsaturated compounds, photoinitiators and as polymeric binders either block copolymers such as styrene-butadiene-styrene and styrene-isoprene-styrene polymers, or butadiene/acrylonitrile polymers with optional carboxyl groups. The former compositions which are in commercial use are particularly useful with alcohol or alcohol-acetate based inks. The latter compositions which are relatively new to the trade are particularly useful with hydrocarbon based inks.

The flexographic printing plates described above being flexible are useful for attaching to printing cylinders, e.g., plastic or metal cylinders. It is desirable that the printing plates be easily mounted on such printing cylinders of various circumference and be retained or not lift off from the printing cylinder during printing. In their manufacture and use photosensitive flexographic printing plates undergo many treatments including: polymerization of the lower regions of the photosensitive layer to form a floor, imagewise exposure to actinic radiation, liquid development, drying at elevated temperature, finishing by treatment with a halogen-containing solution and postexposure to actinic radiation. Ordinarily these treatments are accomplished with a flat flexographic printing plate. When the printing plates are mounted on a printing cylinder, however, it was found that the printing plate has a tendency to lift off or pull away from the cylinder during printing due to its relative stiffness and resistance to bending, particularly in thick plates.

A technique has been recommended to improve conformity of the printing plate to a printing cylinder, particularly when the cylinder is smaller than 4 inches (ca. 10.2 cm) in diameter. An imagewise exposed and developed printing plate is placed, image side up, in an oven or other suitable dryer for about 15 to 20 minutes at a temperature not exceeding 60° C. The printing plate is removed from the oven or dryer and is rolled up immediately image side or printing side out and placed in a three inch (7.6 cm) inner diameter tube for about 15 to 20 minutes. Such a process while helpful in mounting flexographic printing plates on cylinders does not provide a printing plate with long lasting curl.

It is an object of this invention that a process be provided for instilling a permanent curl in a photosensitive flexographic printing plates. Another object is to provide the permanent curl in photosensitive flexographic printing plates with little change in the normal process of printing plate preparation.

BRIEF DESCRIPTION OF THE DRAWING

The FIGURE of the drawing shows a perspective view in elevation of a flexographic relief printing plate mounted on a cylinder for treatment in the process of the invention, the ends of the plate being shown in broken lines.

Wrapped around a cylinder 1 is a flexographic relief printing plate 2 with ends 3 and 4 parallel and closely adjacent to one another. A brace 5 is present over the ends of the plate to keep them snug against the cylinder 1. The plate 2 including brace 5 is attached to the cylinder 1 by means of thin ties 6 placed at each end of the plate and cylinder. Brace 5 and ties 6 should not cover or interfee with the relief imageon plate 2.

DISCLOSURE OF THE INVENTION

In accordance with this invention there is provided a process for providing a permanent curl in a flexographic printing plate having solvent-insoluble, elastomeric printing reliefs prepared by liquid development, the printing plate comprising a flexible sheet support, and a photopolymerized layer of a photosensitive, elastomeric composition having a dry thickness of about 0.005 inch to about 0.250 inch, the process comprising, after liquid development, the printing plate is dried at a temperature in the range of about 20° to 80° C. for 0.25 hour to 24 hours and is postexposed by overall exposing the dry printing relief to a source of actinic radiation for 1 to 30 minutes, at least the postexposure occurring while the printing plate is present on a curved surface.

The photosensitive elastomeric compositions used in the process of this invention comprise a polymer of a conjugated diolefin hydrocarbon, a nongaseous, ethylenically unsaturated compound, an organic, radiation-sensitive, free-radical generating photoinitiator or system as well as other additives discussed below. The compositions may be used in layer form or the layer may be adhered to flexible supports, or a temporary support may be used. Another configuration may have a cover sheet and polymeric layer on each side of the photosensitive layer. Useful flexible supports include: plastic films and metal sheets, open or closed cell foams, compressible rubber layers, or a combination of foams and rubber layers with plastic films. When the combination support is used the plastic film is generally adjacent to the photosensitive layer. A polyamide coated film, e.g., polyester such as polyethylene terephthalate, provides a suitable temporary support. Examples of such supports include but are not limited to polymeric film supports such as polyethylene terephthalate, flame-treated polyethylene terephthalate, electron-discharge treated polyethylene terephthalate, polyimide, e.g., film as disclosed in U.S. Pat. No. 3,179,634 which is incorporated by reference, etc., and thin metal supports such as aluminum, tin-plated steel (dull or shiny). The polymeric supports generally have a thickness in the range of 0.001 inch to 0.007 inch (0.025 to 0.18 mm). The metal supports generally have a thickness in the range of 0.010 to 0.0115 inch (0.25 to 0.29 mm) for aluminum and 0.008 to 0.010 inch (0.20 to 0.25 mm) for tin plated steel. Examples of foam supports include open or closed cell foams, e.g., polyvinyl chloride, polyurethane, ethylenepropylenediene rubber, neoprene, etc. Examples of compressible rubbers include: styrene/isoprene block copolymers, butadiene/acrylonitrile copolymers, natural rubber, etc.

The photosensitive compositions disclosed herein are developable in their unexposed state in aqueous, semiaqueous basic, or solvent solutions depending on the particular polymeric binder or binders present in the photosensitive composition. The photosensitive layers are in the thickness range of 0.005 to 0.250 inch (about 0.13 to 6.35 mm) or more.

One essential ingredient of the photosensitive, elastomeric composition is an elastomeric polymeric binder. Suitable binders include natural or synthetic polymers of conjugated diolefin hydrocarbons. Examples of the binders include: 1,2-polybutadiene, 1,4-polybutadiene, butadiene/acrylonitrile, butadiene/styrene, block copolymers of the A-B-A type, e.g., styrene-butadiene-styrene block copolymer, styrene-isoprene-styrene block copolymer, etc., and copolymers of the binders. The block copolymers may be of the linear, radial, or sequential type. The preferred binders are the styrene-isoprene-styrene or styrene-butadiene-styrene block copolymers and butadiene/acrylonitrile copolymers optionally having a carboxyl content.

Useful linear block copolymers of this invention have at least one unit of the general formula, A-B-A, wherein each A is an independently selected nonelastomeric polymer block having a number average molecular weight ($\overline{Mn}$) of 2000–100,000 and a glass transition temperature above 25° C. and B is an elastomeric polymer block having a number average molecular weight between about 25,000 and 1,000,000 and a glass transition temperature below about 10° C. The nonelastomeric blocks, A, having between them an elastomeric block, B, together comprise the unit A-B-A which represents the copolymers uniquely suitable for use in combination with the photopolymerizable components in the compositions of the invention. This unit may comprise the entire general formula of the copolymer; it may be appended to another polymer chain; or it may be repeating. It is, of course, possible to vary the precise nature of the unit within the scope of the invention, e.g., by using two different nonelastomeric terminal blocks, A, wherein the glass transition temperature of one terminal block is between −30° C. and +25° C. or by creating block or graft polymeric substitutions in blocks A and B. Preferably, the elastomeric mid-section blocks, B, are polymers of aliphatic conjugated diolefins while the nonelastomeric blocks, A, are those formed by polymerizing alkenyl aromatic hydrocarbons, preferably vinyl substituted aromatic hydrocarbons, and still more preferably vinyl monocyclic aromatic hydrocarbons. The block copolymers are disclosed in Holden et al. U.S. Pat. No. 3,265,765 and counterpart British Patent No. 1,000,090, hereby incorporated by reference. Particularly preferred species of the subject copolymers comprise block copolymers of polystyrene terminal groups connected by a mid-section of polyisoprene or polybutadiene, e.g., polystyrene-polyisoprene-polystyrene or polystyrene-polybutadiene-polystyrene, the polydiene block being 70 to 90% by weight of the block copolymer. Other typical block copolymers useful in this invention are polystyrene-polybutadiene-polystyrene and polystyrene-polyisoprene-polystyrene block copolymers which have been hydrogenated according to the teachings of Jones, U.S. Pat. No. 3,431,323 and Hefele et al., U.S. Pat. 3,333,024. The hydrogenated block copolymers have the additional advantage of improved thermal and oxidative resistance. However, some residual unsaturation in hydrogenated block copolymers is desirable, since only very small concentrations of monomer are then needed in the photosensitive compositions to reduce solvent solubility upon exposure to actinic radiation. Still other typical blockcopolymers useful in this invention are those wherein the terminal blocks are polyalkyl styrenes, e.g., poly(α-methyl styrene)-polyisoprene-poly (α-methyl styrene), and those composed of a plurality of polymer blocks, e.g., polyisoprene-polystyrene-polybutadiene-polystyrene-polyisoprene.

The number average molecular weights for the block copolymers can be determined by membrane osmometry utilizing a gel cellophane 600 W membrane manufactured by Arro Laboratories, Inc., Joliet, IL and toluene as the solvent at 29° C. The $\overline{Mn}$ for the nonelastomeric polymer blocks and elastomeric polymer blocks are preferably determined as follows:

A. The molecular weight of the first block (polystyrene) can be measured by gel permeation chromatography (GPC) of a terminated sample removed immediately after the polymerization. The chromatograph is calibrated using commercially available polystyrene molecular weight standards.

B. The $\overline{Mn}$ of the second block (polyisoprene or polybutadiene) can be determined in the following manner:

(1) measuring by suitably calibrated GPC the $\overline{Mn}$ of a sample of polystyrene-polyisoprene (or polybutadiene) diblock polymer terminated and removed immediately after its polymerization, and (2) subtracting from this value the $\overline{Mn}$ of the first block as determined in (A) above.

C. The $\overline{Mn}$ of the third block (polystyrene) can be determined in the same general manner:

(1) measuring by suitably calibrated GPC the $\overline{Mn}$ of the sample of polystyrene-polyisoprene (or polybutadiene)-polystyrene triblock polymer, and (2) subtracting from this value the $\overline{Mn}$ of the diblock polymer obtained in (B) above. The block copolymers are manufactured by Shell Chemical Company and sold under the trademark "Kraton ®".

Useful butadiene/acrylonitrile copolymers are high molecular weight butadiene/acrylonitrile copolymers (a) having a number average molecular weight ($\overline{Mn}$) in the range of about 20,000 to about 75,000, preferably in the range of about 25,000 to about 50,000. The $\overline{Mn}$ for the polymers described herein can be determined by gel permeation chromatography employing a polybutadiene standard. The acrylonitrile content of the polymers varies from about 10 to about 50% by weight, preferably from about 15 to about 40%. Optionally, the copolymer also has a carboxyl content of 0 to about 15% by weight. When the copolymer contains carboxyl groups, the carboxyl content is preferably in the range of about 1 to about 15%, most preferably in the range of about 2 to about 10% by weight. The copolymer is present in an amount of about 55 to 90% by weight, based on the total weight of the composition, and preferably about 60 to about 75% by weight. At least about 55% by weight of the copolymer is necessary to give adequate flexibility and physical integrity to the photosensitive elements, particularly for flexographic plates.

Carboxyl groups may be incorporated into the high molecular weight copolymer by addition to the polymerization process of a carboxyl containing monomer, e.g., acrylic or methacrylic acid, or a monomer which is convertible to a carboxyl containing group, e.g., maleic anhydride or methyl methacrylate. Such polymers are available commercially from several sources, e.g., from the B. F. Goodrich Chemical Company under the trade name Hycar ®.

Another essential ingredient of the photosensitive compositions of this invention is a nongaseous, ethylenically unsaturated compound containing at least one terminal ethylenic group (b). This compound should be capable of forming a high polymer by free-radical initiated chain-propagating addition polymerization and be compatible with the high molecular weight polymers (a) described above. Ethylenically unsaturated compounds which are compatible with the A-B-A type block copolymers set forth above are disclosed in British Patent No. 1,366,769 incorporated by reference. Many of these monomers are specifically disclosed below. One class of suitable ethylenically unsaturated compounds includes unsaturated esters of alcohols, especially such esters of α-methylene carboxylic acids and substituted α-methylene carboxylic acids, more especially such esters of alkylene polyols and polyalkylene polyols, and most especially alkylene polyol di- and tri-acrylates and polyalkylene polyol di- and tri-acrylates prepared from alkylene polyols of 2-15 carbon atoms or polyalkylene ether polyols or glycols of 1-10 ether linkages.

The following specific compounds are further illustrative of this class: ethylene glycol diacrylate, diethylene glycol diacrylate, glycerol diacrylate, glycerol triacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol triacrylate, pentaerythritol tetramethacrylate, 1,3-propanediol diacrylate, 1,3-pentanediol dimethacrylate, p-α,α-dimethylbenzylphenyl acrylate, t-butyl acrylate, N,N-diethylaminoethyl acrylate, diethylaminoethyl methacrylate, 1,4-butanediol diacrylate, hexamethylene glycol diacrylate, decamethylene glycol diacrylate, 2,2-dimethylolpropane diacrylate, tripropylene glycol diacrylate, 2,2-di(p-hydroxy-phenyl)propane diacrylate, 2,2-di(p-hydroxyphenyl)propane dimethacrylate, polyoxyethyl-2,2-di(p-hydroxyphenyl)propane triacrylate (molecular weight of 462), 1,4-butanediol dimethacrylate, hexamethylene glycol dimethacrylate, 2,2,4-trimethyl-1,3-pentanediol dimethacrylate, 1-phenylethylene-1,2-dimethacrylate, trimethylolpropane trimethacrylate, triethylene glycol diacrylate, ethylene glycol acrylate phthalate, polyoxyethyltrimethylolpropane triacrylate, diacrylate and dimethacrylate esters of diepoxy polyethers derived from aromatic polyhydroxy compounds such as bisphenols, novolaks and similar compounds such as those described by Crary in U.S. Pat. No. 3,661,576, which is incorporated by reference, the bis-acrylates and methacrylates of polyethylene glycols of molecular weight 200-500, etc.

Another class of suitable ethylenically unsaturated compounds includes the compounds disclosed by Martin and Barney in U.S. Pat. No. 2,927,022 which is incorporated by reference, e.g., those having a plurality of addition polymerizable ethylenic linkages, particularly when present as terminal linkages, and especially those wherein at least one and preferably most of such linkages are conjugated with a double bonded carbon, including carbon double bonded to carbon and to heteroatoms such as nitrogen, oxygen and sulfur. Preferred are such materials wherein the ethylenically unsaturated groups, especially the vinylidene groups, are conjugated with ester or amide structures. Specific examples of such compounds include unsaturated amides, particularly those of α-methylene carboxylic acids, especially with α-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis(methacrylamidopropoxy)ethane, β-methacrylamidoethyl methacrylate, N-(β-hydroxyethyl)-β-(methacrylamido)ethyl acrylate, and N,N-bis(β-methacryloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; diallyl fumarate; etc.

Additional ethylenically unsaturated compounds which may be used include styrene and derivatives thereof: 1,4-diisopropenylbenzene, 1,3,5-triisopropenylbenzene; itaconic anhydride adducts with hydroxyethyl acrylate (1:1), itaconic anhydride adducts with liquid butadiene/acrylonitrile polymers containing terminal amino groups, and itaconic anhydride adducts with the diacrylate and dimethacrylate esters of diepoxy polyethers described in Crary U.S. Pat. No. 3,661,576; polybutadiene and butadiene/acrylonitrile copolymers containing terminal and pendant vinyl groups; and unsaturated aldehydes, such as sorbaldehyde (2,4-hexadienal).

Ethylenically unsaturated compounds which are water soluble or contain carboxyl or other alkali-reactive groups are especially suitable when aqueous basic-developable systems are involved. In addition, the polymerizable, ethylenically unsaturated polymers of Burg, U.S. Pat. No. 3,043,805; Martin, U.S. Pat. No. 2,929,710; and similar materials may be used alone or mixed with other materials. Acrylic and methacrylic esters of adducts of ethylene oxide and polyhydroxy compounds such as those described by Cohen and Schoenthaler in U.S. Pat. No. 3,380,831 are also useful. The photocrosslinkable polymers disclosed in Schoenthaler, U.S. Pat. No. 3,418,295, and Celeste, U.S. Pat. No. 3,448,089, may also be used. All of these patents are incorporated by reference.

The ratio of the weight of block copolymer used to the weight of addition polymerizable ethylenically unsaturated compound use is 99:1 to about 1:1.

The amount of unsaturated compound present in a photosensitive composition containing a butadiene/acrylonitrile copolymer should be in the range of about 2 to about 40% by weight, based on the total weight of composition. The specific amount for optimum results will vary depending on the particular polymers used. Preferably the amount of unsaturated compound is in the range of about 5 to about 25%.

The ethylenically unsaturated compound preferably has a boiling point at normal pressure of over about 100° C. The most preferred ethylenically unsaturated compounds are triethylene glycol diacrylate, triethylene glycol dimethacrylate, hexamethylene glycol dimethacrylate and hexamethylene glycol diacrylate.

The photosensitive compositions of this invention substantially do not scatter actinic radiation when in the form of thin layers, as described above. In order to secure a substantially transparent mixture, i.e., a non-radiation-scattering mixture, the polymer binder components should be compatible with, and preferably soluble in, the ethylenically unsaturated compound in the proportions used.

By "compatible" is meant the ability of two or more constituents to remain dispersed in one another without causing any significant amount of scattering of actinic radiation. Compatibility is often limited by the relative proportions of the constituents, and incompatibility is evidenced by formation of haze in the photosensitive composition. Some slight haze can be tolerated from such compositions before or during exposure in the preparation of printing reliefs, but when fine detail is desired, haze should be completely avoided. The amount of ethylenically unsaturated compound, or any other constituent, used is therefore limited to those concentrations which do not produce undesired light scatter or haze.

Another essential ingredient of the photosensitive compositions of this invention is an organic, radiation-sensitive, free-radical generating system (c). Practically any organic, radiation-sensitive, free-radical generating system which initiates polymerization of the unsaturated compound and does not excessively terminate the polymerization can be used in the photosensitive compositions of this invention. The term "organic" is used here and in the claims to designate compounds which contain carbon, and one or more of oxygen, hydrogen, nitrogen, sulfur and halogen, but no metal. Because process transparencies transmit heat originating from conventional sources of actinic radiation, and since the photosensitive compositions are usually prepared under conditions resulting in elevated temperatures, the preferred free-radical generating compounds are inactive thermally below 85° C and more preferably below 185° C. They should be dispersible in the composition to the extent necessary for initiating the desired polymerization or crosslinking under the influence of the amount of radiation absorbed in relatively short term exposures. These initiators are useful in amounts from about 0.001 to about 10% by weight, and preferably from about 0.1 to about 5% based on the total weight of the solvent-free photosensitive composition.

The free-radical generating system absorbs radiation within the range of about 2000 to about 8000 Å and has at least one component that has an active radiation absorption band with molar extinction coefficient of at least about 50 within the range of about 2500 to about 8000 Å, and preferably about 2500 to about 5000 Å. The term "active radiation absorption band" means a band of radiation which is active to produce the free radicals necessary to initiate polymerization or crosslinking of the unsaturated material.

The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such free-radical generating compounds can be utilized in the practice of the invention and include aromatic ketones such as benzophenone, Michler's ketone [4,4'-bis(dimethylamino)benzophenone], 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-phenyl-2,2-dimethoxyacetophenone(2,2-dimethoxy-1,2-diphenyl ethanone), 2-ethylanthraquinone, phenanthraquinone, 2-t-butylanthraquinone, 1,2-benzanthraquinone, 2,3-benzanthraquinone, 2,3-dichloronaphthoquinone, benzil dimethyl acetal, and other aromatic ketones; benzoin, benzoin ethers such as benzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl-4,5-di(m-methoxyphenyl)-imidazolyl dimer, 2-(o-fluorophenyl)-4,5-diphenylimidazolyl dimer, 2-(o-methoxyphenyl(-4,5-diphenylimidazolyl dimer, 2-(p-methoxyphenyl(-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, etc., as disclosed in U.S. Pat. Nos. 3,479,185 and 3,784,557 and in British Pat. Nos. 997,396 and 1,047,569. These patents are incorporated herein by reference.

The imidazolyl dimers can be used with a free-radical producing electron donor such as 2-mercaptobenzoxazole, Leuco Crystal Violet or tri(4-diethylamino-2-methylphenyl)methane. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863 which is incorporated by reference.

The photosensitive compositions may also contain a small amount of thermal addition polymerization inhibitor, e.g., 0.001% to 2.0%, based on the weight of the total solvent-free photosensitive composition. Suitable inhibitors include hydroquinone and alkyl and aryl-substituted hydroquinones, 2,6-di-tert-butyl-4-methylphenol, p-methoxyphenol, tert-butylpyrocatechol, pyrogallol, β-naphthol, 2,6-di-tert-butyl-p-cresol, phenothiazine, pyridine, nitrobenzene, dinitrobenzene and the nitroso dimer inhibitor systems described in U.S. Pat. No. 4,168,982 which is incorporated by reference. Other useful inhibitors include p-toluquinone, chloranil and thiazine dyes, e.g., Thionine Blue G (CI 52025), Methylene Blue B (CI 52015) and Toluidine Blue (CI 52040). Such compositions can be photopolymerized or photocrosslinked without removal of the inhibitor. The preferred inhibitors are 2,6-di-tert-butyl-4-methylphenol and p-methoxyphenol.

The oxygen and ozone resistance of the printing reliefs can be improved by incorporating into the photosensitive composition a suitable amount of compatible well known antioxidants and/or antiozonants. Antioxidants useful in this invention include: alkylated phenols, e.g., 2-6-di-tert-butyl-4-methylphenol; alkylated bisphenols, e.g., 2,2-methylene-bis-(4-methyl-6-tert-butylphenol); 1,3,5-trimethyl-2,4,6-tris-(3,5-di-tert-butyl-4-hydroxybenzyl)benzene; 2-(4-hydroxy-3,5-di-tert-butylanilino)-4,6-bis-(n-octyl thio)-1,3,5-triazine; polymerized trimethyldihydroquinone; and dilauryl thiopropionate.

Antiozonants useful in this invention include: microcrystalline wax and paraffin wax; dibutylthiourea; 1,1,3,3-tetramethyl-2-thiourea; Antiozonant AFD, a product of Nafton Co.; norbornenes, e.g., di-5-norbornene-2-methyl adipate, di-5-norbornene-2-methyl terephthalate; Ozone Protector 80, a product of Reichhold Chemical Co.; N-phenyl-2-naphthylamine; unsaturated vegetable oils, e.g., rapeseed oil, linseed oil, safflower oil; polymers and resins, e.g., ethylene/vinyl acetate copolymer resin, chlorinated polyethylene, chlorosulfonated polyethylene, chlorinated ethylene/methacrylic acid copolymer, polyurethanes, polypentadienes, polybutadiene, furfural-derived resins, ethylene/propylene/diene rubber, diethylene glycol ester of rosin and α-methylstyrene/vinyltoluene copolymer. Ozone resistance of the printing relief produced can also be improved by annealing it at elevated temperatures prior to use.

If desired, the photosensitive compositions can also contain immiscible, polymeric or nonpolymeric organic or inorganic fillers or reinforcing agents which are essentially transparent at the wavelengths used for exposure of the layer of the photosensitive composition and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

The photosensitive layer preferably contains a compatible plasticizer to lower the glass transition temperature of the binder and facilitate selective development. The plasticizer may be any of the common plasticizers compatible with the polymeric binders. Among the common plasticizers are dialkyl phthalates, alkyl phosphates, polyethylene glycol, polyethylene glycol esters, and polyethylene glycol ethers. Other useful plasticizers include oleic acid, lauric acid, etc. Polyesters are preferred plasticizers, e.g., polyethylene sebacate, etc. The plasticizer is generally present in an amount of 1 to 15% by weight based on weight of total solids of the photosensitive composition.

The photosensitive compositions of this invention can be prepared in any suitable way by mixing the ingredients, i.e., (a) the polymeric binder, (b) the compatible ethylenically unsaturated compound, and (c) the free-radical generating system. For example, flowable compositions can be made by mixing them and other desired adjuvants in any order and, if desired, with the aid of a solvent such as chlorinated hydrocarbons, e.g., methylene chloride, chloroform, methyl chloroform, chlorobenzene, trichloroethylene, tetrachloroethylene and chlorotoluene; ketones, e.g., methyl ethyl ketone, diethyl ketone and methyl isobutyl ketone; aromatic hydrocarbons, e.g., benzene, toluene and xylene; and tetrahydrofuran. The above solvents can contain as diluents acetone; lower molecular weight alcohols, e.g., methyl, ethyl and propyl alcohol; and esters, e.g., methyl, ethyl and butyl acetate. The solvent can be removed later by heating the admixture or extruded layer.

Conventional milling, mixing, and solution techniques can be used in making these compositions, the particular technique varying with the differences in properties of the respective components. The homogeneous, substantially nonradiation-scattering compositions, are formed into sheets in any desired manner. For example, solvent-casting, hot pressing, calendering, or extrusion are suitable methods for preparing layers of the desired thickness.

The photosensitive elements of this invention can be made by solvent casting or by extruding, calendering or pressing at an elevated temperature of the photosensitive composition into the form of a layer or self-supporting sheet on a suitable casting wheel, belt or platen. The layer or sheet may be laminated to the surface of the flexible support described above and may be adhered by means of an adhesive blend as described below. When a solution is used the coating may be made on an adhesive-bearing support.

The thickness of the photosensitive layer is a direct function of the thickness desired in the relief image and this will depend on the subject being reproduced and the ultimate use of the relief, e.g., soft reliefs are useful for flexographic printing. In general, the thickness of the polymerizable layer will be less than about 0.250 inch, e.g., it will vary from about 0.005 to about 0.250 inch (0.0127–0.635 cm) and layers within this range of thickness will be used for the majority of the printing plates.

Between the photosensitive layer butadiene/acrylonitrile printing plate and flexible support is preferably placed a layer of an adhesive blend which comprises at least two polymers taken from a group of the following four polymers:

(1) Polyester resin, a condensation polymer of ethylene glycol, terephthalic acid, isophthalic acid and azelaic acid in a molar ratio of about 6:2:1:3 have a $\overline{Mn}$ of 19,000 and $\overline{Mw}$ of 37,000;

(2) Polyether polyurethane resin, a crystalline, thermoplastic resin having a Brookfield viscosity of 100–1200 centipoises using 15% by weight solids in methyl ethyl ketone and a Brookfield spindle #3 at 12 rpm, and an adhesive activation temperature in the range of 54° to 63° C. The polyether polyurethane has an elongation at yield of 15%, elongation at break of 615%, modulus at 400% elongation of 600 psi (42.18 kg/cm$^2$), decrystallization temperature of about 49° C.;

(3) Polyamide resin, a translucent light amber color, Ball and Ring softening point of 132–145° C., melt viscosity of 40 to 60 poises at 210° C., flash point greater than 299° C., percent water absorption for 1 day is 0.7, for 7 days is 1.6, tensile yield of 460 psi (32.34 kg/cm$^2$), tensile break of 450 psi (31.64 kg/cm$^2$) and elongation of 560%. (The tensile yield, tensile break and elongation are determined at 24° C. according to ASTM Procedure D-1708); and (4) Polyamide resin, a translucent light amber color, Ball and Ring softening point of 150°–160° C.; viscosity of 28–38 poises at 210° C, percent water absorption for 1 day is 1.5, for 7 days is 2.8, and

|  | −18° C. | 24° C. | 60° C. |
| --- | --- | --- | --- |
| Tensile yield, psi (kg/cm$^2$) | 980 (68.89) | 400 (28.12) | 70 (4.92) |
| Tensile break, psi (kg/cm$^2$) | 2200 (154.66) | 360 (25.31) | 50 (3.52) |
| elongation (%) | 350 | 250 | 40 |

(The tensile yield, tensile break and elongation are determined at the stated temperatures according to ASTM Procedure D-1708).

The number average molecular weights ($\overline{Mn}$) of the resins can be determined by gel permeation chromatography (GPC) employing a known standard, e.g., polybutadiene, as known to those skilled in the art. The weight average molecular weights ($\overline{Mw}$) of the resins can be determined by using a light scattering technique using known standard samples, e.g., polystyrene, polymethacrylic acid, polymethylmethacrylate, etc., as known to those skilled in the art.

The particular polymers can be present in the adhesive blend in the following ranges based on the total weight of resin in the adhesive composition: (1) 0 to 78% by weight, (2) 0 to 78% by weight, (3) 0 to 94% by weight, and (4) 0 to 97% by weight. Preferred adhesive blends containing four, three and two resin components are set forth below wherein the percentages are by weight based on the total resin content.

Percentage ranges for the quaternary adhesive blend are:
(1) 25 to 31%, preferably 25%,
(2) 25 to 31%, preferably 25%,
(3) 25 to 19%, preferably 25%, and
(4) 25 to 19%, preferably 25%.

Percentage ranges for two tertiary adhesive blends, A and B, are:

A.

(1) 1 to 78%, preferably 1 to 65%,
(2) 1 to 78%, preferably 1 to 65%, and
(3) 1 to 94%, preferably 1 to 90%; and

B.

(1) 1 to 63%, preferably 1 to 45%,
(3) 1 to 93%, preferably 1 to 85%, and
(4) 1 to 97%, preferably 1 to 90%.

Percentage ranges for five binary adhesive blends, C to G, are:

C.

(1) 7 to 77%, preferably 15 to 50%, most preferably 30% and
(3) 93 to 23%, preferably 85 to 50%, most preferably 70%.

(This adhesive blend is particularly preferred.)

D.

(1) 3 to 60%, more preferably 5 to 30%, and
(4) 97 to 40%, more preferably 95 to 70%

E.

(1) 23 to 77%, more preferably 35 to 45%, and
(2) 77 to 23%, more preferably 65 to 55%.

F.

(2) 10 to 60%, preferably 25 to 30%, and
(4) 90 to 40%, preferably 75 to 70%; and

G.

(2) 7 to 72%, preferably 15 to 50%, and
(3) 93 to 28%, preferably 85 to 50%.

The adhesive blends of this invention provide an adhesion value for the photosensitive layer to the support of at least 3 lbs/inch (53.57 kg/m) and generally much greater adhesion, e.g., in the range of 8 lbs/inch (142.86 kg/m) or more. These adhesion values are sufficient when the elements of the invention are used as printing plates, particularly flexographic printing plates.

The adhesive blends preferably contain additives such as antiblocking agents, colorants, e.g., dye, etc. Useful antiblocking agents include: preferably polyolefin particles or beads but also other hard particles or beads such as silicon dioxide, etc. Dioctyl sodium sulfosuccinate, a surfactant, can be used. A preferred polyolefin material is described in the examples. The bead size of the antiblocking agents can be greater than the thickness of the adhesive layer resulting in beads partially protruding out of the layer of the adhesive blend. Such a configuration appears to have little or no effect on the degree of adhesion. Many types of colorants or dyes are also useful in the adhesive layer. A preferred dye is Du Pont Milling Blue BL (CI Acid Blue 59).

Other useful dyes include: Methylene Violet (CI Basic Violet 5), "Luxol" Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), CI 109 Red Dye, Rhodamine 3 GO (CI Basic Red 4), Rhodamine 6 GDN (CI Basic Red 1 or CI 45160), Fuchsine dye (CI 42510), Calcocid Green S (CI 44090) and Anthraquinone Blue 2 GA (CI Acid Blue 58).

An adhesive solution is prepared by adding the ingredients generally in the following order to the solvent with continuous stirring: polymers, polyolefin antiblocking agent, colorants. Useful solvents include mixtures, e.g., methylene chloride/ethyl acetate, methylene chloride/n-butyl acetate, methylene chloride/cyclohexanone, methylene chloride/methanol/Cellosolve ®, etc. and preferably a mixture of methylene chloride/Cellosolve ®, 90/10 parts. Additional solvent can be added to make up any weight loss. The choice of solvents is governed by the need to provide the fastest practical drying rates without blistering the coating and without leaving behind small amounts of solvent. The solvents should also have a solubilizing effect on the dyes that may be present.

The adhesive solution is then applied to the flexible support by known means, e.g., coated by use of a doctor blade or in a commercially available continuous web coater-dryer to provide a dry coating weight in the range of about 80 to 500 mg/dm² preferably about 260 to 300 mg/dm². A most preferred coating weight of the adhesive layer is about 260 mg/dm². Generally, the adhesive layer has a dry thickness of 0.0008 to 0.001 inch (0.020 to 0.025 mm). In a continuous coating the web speed can vary, e.g., 15 to 150 feet/minute (4.57 to 45.72 m/minute). The drying temperature ranges from 60 to 130° C., preferably 80°–90° C.

A preferred flexible support is flame-treated polyethylene terephthalate, 0.001 to 0.007 inch (0.025 to 0.18 mm) thick, preferably 0.005 inch (0.13 mm) in thickness. Flame-treatment of polymeric films is known. The following U.S. patents describe useful procedures and apparatus for flame treating polymeric films: Bryan U.S. Pat. No. 3,145,242, and Thompson U.S. Pat. Nos. 3,360,029 and 3,391,912 which are incorporated by reference. The fuel equivalence ratio of the combustible gas mixture, $\phi$, is 1.4 which is equal to 5(propane flow rate)/[(oxygen flow rate) +(0.21 air flow rate)]. All flow rates are in standard cubic feet or cubic liters/minute. The web speed is 175 lineal feet/minute (53.34 m/minute).

The dried adhesive coated support can be adhered immediately to the photosensitive layer or can be stored for subsequent adherence. The adhesive-coated support can be laminated to the photosensitive layer in a press, e.g., at 140° to 160° C. at a pressure of 20,000 to 30,000 psi (1406 to 2109 kg/cm²) for up to about three minutes, followed by cooling in the press to less than 60° C. Preferably the photosensitive element is prepared by calendering. The photosensitive layer, which preferably is formed by extruding through a die, has present on the side remote from the side adjacent the adhesive layer a 0.005 inch (0.13 mm) thick polyethylene terephthalate film which subsequently acts as a protective cover sheet. Other films can be used such as polystyrene, polyethylene, polypropylene or other strippable material. There preferably is present between the photosensitive layer and the film cover sheet a thin hard, flexible, solvent-soluble layer, such as a flexible, polymeric film or layer, e.g., a polyamide or a copolymer of ethylene and vinyl acetate. The flexible polymeric film remains on the photosensitive layer after removal of the film cover sheet described above. The flexible polymer film protects for reuse an image-bearing negative or transparency superposed thereon or improves contact or alignment with the photosensitive surface. Prior to the imagewise exposure using the sources described below, the element is exposed through the support to polymerize a predetermined thickness of the photosensitive layer adjacent the adhered support. This polymerized portion of the photosensitive layer is designated a floor. The floor thickness varies with the time of exposure, exposure source, etc. The exposure is generally for 1 to 30 minutes and can be accomplished flat or in the round.

Printing reliefs can be made in accordance with this invention by exposing to actinic radiation selected portions of a photosensitive layer of an element described above, for example, through a process transparency, i.e., an image-bearing transparency or stencil having areas substantially transparent to actinic radiation and of substantially uniform optical density and areas opaque to actinic radiation and of substantially uniform optical density until substantial addition-polymerization or photocrosslinking takes place. During the addition-polymerization or crosslinking, the polymeric binder/ethylenically unsaturated compound composition is converted to the insoluble state in the radiation-exposed portions of the layer, with no significant polymerization or crosslinking taking place in the unexposed portions or areas of the layer. The unexposed portions of the layer are removed by means of a liquid developer for the polymeric binders. The process transparency may be constructed of any suitable material including cellulose acetate film and oriented polyester film.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photosensitive layer underneath the clear portions of the transparency. This results in a polymeric relief having its greatest width at the bottom of the photosensitive layer, i.e., a frustum, the top surface of the relief being the dimensions of the clear area.

Inasmuch as the free-radical generating systems activatable by actinic radiation generally exhibit their maximum sensitivity in the ultraviolet range, the radiation source should furnish an effective amount of this radiation, preferably having a wavelength range between about 2500 Å and 5000 Å. Suitable sources of such radiation, in addition to sunlight, include carbon arcs, mercury-vapor arcs, fluorescent lamps with ultraviolet radiation-emitting phosphors, argon glow lamps, electron flash units and photographic flood lamps. Electron accelerators and electron beam sources through an appropriate mask may also be used. Of these, the mercury-vapor lamps, particularly the sun lamp or "black light" type, and the fluorescent sun lamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc, a sunlamp or high ultraviolet output fluorescent tubes are used at a distance of about 1.5 to about 60 inches (3.8 to 152 cm) from the photosensitive composition. The exposure can be accomplished flat, e.g., in a vacuum frame, or in the round. Exposure temperatures are not particularly critical, but it is preferred to operate at about ambient temperatures or slightly higher, i.e., about 20° to about 35° C.

After exposure, the image may be developed by washing with a suitable developer. The developer liquid should have good solvent or swelling action on the polymeric binder/ethylenically unsaturated compound composition and little action on the insolubilized image or upon the support or adhesive layer in the period required to remove the nonpolymerized or noncrosslinked portions. Suitable developers include: organic solvents, e.g., 2-butanone, benzene, toluene, xylene, trichloroethane, trichloroethylene, methyl chloroform, tetrachloroethylene, and solvent mixtures, e.g., tetrachloroethylene/n-butanol, etc. When the high molecular weight butadiene polymer component contains carboxyl groups, suitable developers include: aqueous base to which a water-soluble organic solvent may be added. Suitable specific developer mixtures include sodium hydroxide/isopropyl alcohol/water, sodium carbonate/water, sodium carbonate/2-butoxyethanol/water, sodium borate/2-butoxyethanol/water, sodium silicate/2-butoxyethanol/glycerol/water, sodium carbonate/2-(2-butoxyethoxy)ethanol/water and sodium hydroxide (0.5 weight percent) in 16.6 volume percent 2-(2-butoxyethoxy) ethanol in water, which is preferred. The particular developer combination chosen will depend upon the carboxyl content of the photosensitive composition and the properties and amounts of the binders employed. Other aqueous developer combinations which may be employed are described in U.S. Pat. No. 3,796,602 which is incorporated by reference. These aqueous base/water-soluble organic solvent combinations may be preferred in some cases because of their low cost, nonflammability and reduced toxicity.

Development may be carried out at about 25° C., but best results are sometimes obtained when the solvent is warm, e.g., 30°-60° C. Development time can range from 1 to 120 minutes, preferably 1 to 25 minutes.

In the development step where the relief is formed, the developer may be applied in any convenient manner, as by pouring, immersion, spraying, or roller application. Brushing aids in the removal of the unpolymerized or uncrosslinked portions of the composition. When the printing plate undergoes aqueous development a water rinse is subsequently applied, e.g., for about 5 to 300 seconds, to the developed plate to remove traces of developer from the plate surface. The term "aqueous development" includes the water rinse.

After development the printing plate is preferably heated briefly in a forced hot air dryer or other heating means. This brief drying period evaporates some but not all of the solvent making the plate less pasty and easier to handle in subsequent steps. Generally the plate is heated at a temperature range of 30° to 60° C. for 1 to 5 minutes. The brief heating can be accomplished with the plate flat or on a cylinder as noted above.

In the event that the photopolymerizable composition of the printing plate comprises a block copolymer binder as described above, it is often desirable after removing the plate from the heat source to wipe the plate surface with a cloth dampened with methylchloroform (in a hood). Printing plates of this type are susceptible to an undesirable surface defect known as "orange peel" which the wiping step eliminates.

The printing plate is attached or fastened to a cylinder, preferentially of the same dimension that will subsequently be used for printing, for drying. Practically any type cylinder is satisfactory, e.g., steel, plastic, e.g., polyvinyl chloride, cardboard, etc. The printing plate can be attached to the cylinder by plastic coated wire ties and a brace, as shown in the Figure, e.g., steel, plastic, etc. Other fastening means are possible provided that no portion of the relief images is covered since the image may be disfigured due to compression as the plate dries. Suitable fastening means include: rubber fasteners, metal or plastic clamps, tacking plate to cylinder, vacuum drawdown, etc. For drying, the plate cylinder is placed in a dryer equipped with an infrared heat source such as a Cyrel ® Dryer (registered trademark E. I. du Pont de Nemours and Company). In such a dryer the plate-cylinder units of one foot or less in length can be stood on end. Other drying sources can be used but some may have to be modified to accommodate the plate-cylinder unit. Generally, the printing plate is dried at temperatures up to 125° C., preferably for about one hour at a temperature of about 50° to 80° C. Drying of the printing plate can also be accomplished in the flat mode is noted in Examples 3 and 7 below but is less preferred.

The plate is then contacted in either the curved mode or flat mode with an aqueous treatment solution prepared as described below. The plate can either be flooded with the aqueous treatment solution or can be dipped in the treatment solution, the latter being preferred. The treatment solution is maintained in contact with the printing plate for from 15 seconds to 40 minutes, more preferably from 1 minute to 10 minutes. The treatment solution is preferably used at ambient temperature but can be heated up to about 35° C. Various finishing or detackifying solutions can be used, e.g., (a) aqueous hypochlorite solution, e.g., 900 parts water, 90 parts Clorox ®, 10 parts conc. HCl;

(b) aqueous bromine solution, 0.01 to 3.5% by weight, preferrably potassium bromate-potassium bromide having a solution pH of 1.2. The bromine solution is prepared as follows:

1800 mls of tap water is added 20 ml of conc. hydrochloric acid with mixing. To this solution is added with mixing a mixture of 200 ml tap water, 10 g potassium bromide and 2.8 g potassium bromate (90.56% $H_2O$/8.81% HCl/0.49% KBr and 0.14% $KBrO_3$). The free bromine concentration is 0.4%.

(c) alkali monopersulfate, e.g., potassium monopersulfate triple salt ($2KHSO_5 \cdot KHSO_4 \cdot K_2SO_4$) and a bromide salt, e.g., potassium bromide, dissolved in aqueous solution. Since both of the components are solids and are nonreactive with one another in the absence of moisture, they can be mixed dry and stored in moisture proof containers for an extended period prior to use. The proportions of dry ingredients in the mixture is from 98 to 10 alkali monopersulfate and from 2 to 90 bromide salt. The potassium salts are particularly preferred since they are significantly less moisture sensitive. However, other alkali salts, e.g., sodium, lithium, etc., are useful if maintained separately from each other until dissolution. No acid is required to be added to the treatment solution which is advantageous. The treatment solution is operable at higher pH ranges than previously known bromine or chlorine treatment solutions including pH values in the neutral region, and above, e.g., 7 to 8.5 or more. The overall pH range is 0.7 to 8.5 or more; or (d) aqueous solution having free bromine or free iodine followed by an aqueous chlorine solution. The aqueous bromine solution can be prepared as described in (b) and (c) immediately above. The free bromine concentration is 0.01 to 3.5% by weight and the treatment time is about 15 seconds to 20 minutes. The iodine solution is preferably prepared by addition of potassium iodide, e.g., 6.4 grams, and iodine, e.g., 12.7 grams, to 200 ml water. The contact time with the printing plate is from 1.5 to 2.5 minutes. The second treatment, aqueous chlorine solution, can be prepared as described in (a) immediately above. The chlorine is equivalent to that supplied by an aqueous solution, 0.001 to 1.0 molar in NaOCl and 0.012 to 1.2 molar in HCl. Treatment time is about 15 seconds to 5 minutes.

A water rinse and brief heating to remove the moisture follow the above halogen finishing treatment. The heating period is normally of about 1 to 5 minutes, preferably 3 minutes, in a dryer equipped with infrared heater such as the dryer described above or another suitable dryer.

Either prior to or subsequent to the above-described finishing treatment the printing plate is attached or reattached to the cylinder as the case may be and is postexposed. The postexposure is accomplished by exposing the plate-cylinder to a source of actinic radiation for 5 to 15 minutes, preferably about 10 minutes, e.g., by placing the plate-cylinder on its side in a high intensity Cyrel ®3040 Exposure Unit (registered trademark E. I. du Pont de Nemours and Company) as described in Example I below. Since the plate is attached to the cylinder the postexposure is generally done first on one side of the plate-cylinder unit then on the other side for the postexposure period. It is also possible to postexpose the mounted printing plate in a rotary exposure unit, e.g., where the lamps surround the plate, or the mounted plate can be automatically rotated in front of the radiation source. Lower intensity actinic radiation sources can be used for the postexposure but of course the periods will have to be extended accordingly.

After removal from the exposure unit, the printing plate is detached from the cylinder. The support can be wiped with an acetone dampened cloth to remove debris from the back, and the plate is trimmed to a suitable size. A permanent curl toward the support side is readily apparent. Generally the curl is self supporting when the plate is placed on a surface although this is not critical to the invention. The curled plate is then ready for attachment to a printing cylinder by means known to those skilled in the art, e.g., sticky-back masking tape, adhesives, ties, etc. Care must be taken not to cover any portion of the printing relief.

BEST MODE FOR CARRYING OUT THE INVENTION

The best mode is illustrated in Example 1 wherein the drying and postexposure occur while the printing plate is present on a curved surface, e.g., a cylinder.

INDUSTRIAL APPLICABILITY

The flexographic printing plates prepared by the process of this invention have excellent curl which is retained over the life of the plate. Such plates are adaptable and easily attached to printing cylinders. The printing plates can be used in all classes of printing but are most applicable to those classes of printing wherein a distinct difference of height between printing and nonprinting areas is required and particularly to the flexographic printing class wherein a resilient print area is required, e.g., for printing on deformable printing surfaces. These classes include those wherein the ink is carried by the raised portion of the relief such as in dry-offset printing, ordinary letterpress printing, the latter requiring greater height differences between printing and nonprinting areas, and those wherein the ink is carried by the recessed portions of the relief such as in intaglio printing, e.g., line and inverted halftone. The plates are also useful for multicolor printing.

The relief and printed images obtained show fidelity to the original transparency both in small detail and in overall dimensions even when the element is imagewise exposed on a cylindrical support. The reliefs have high impact strength, are tough and abrasion-resistant, and have broad ink compatibility, i.e., have good compatibility with a wide range of inks, e.g., water-based inks, hydrocarbon ink and alcohol-based inks.

EXAMPLES

The following examples illustrate the invention wherein the parts and percentages are by weight.

EXAMPLE 1

A photosensitive, thermoplastic composition is prepared as follows:

1.40 parts 2,2-dimethoxy-2-phenylacetophenone is dissolved in a mixture of 5.30 parts hexamethylene glycol diacrylate, 3.70 parts hexamethylene glycol dimethacrylate, 0.166 part 2,6-di-tertiary-butyl-para-cresol and 0.001 part hydroquinone. A solution of C.I. 109 Red Dye (0.003 part) in hydroxyethyl methacrylate (0.13 part) is added to the mixture. This solution is added to 82.30 parts polystyrene-polyisoprene-polystyrene block copolymer (Kraton ® 1107, Lot No. 06BBF, manufactured by Shell Chemical Co., Polymers Division, Houston, Tex.) in a twin screw extruder. A mixture of 6.0 parts α-methyl styrene/vinyl toluene resin (softening point 100° C., refractive index 1.583, viscosity at 25° C. for a 65% solution in toluene is 1.6-1.9 poises, manufactured by Hercules, Inc., Wilmington, DE), and 1.0 part grated microcrystalline hydrocarbon wax (melting point 73°-76° C., flash point 113° C., manufactured by International Wax Refining Co., Valley Stream, N.Y.) is melted at about 100° C. and is metered into the photosensitive mixture in the extruder. The twin screw extruder performs the function of melting, mixing, deaerating and filtering the photosensitive composition.

The following coating solution is prepared:

| Ingredient | Amount (%) |
|---|---|
| Methylene chloride | 81.0 |
| Methanol | 2.0 |
| N—methyl pyrolidone | 10.0 |
| Polyamide resin, Lot No. OB25005[1] | 7.0 |

[1] The polyamide resin, Macromelt ® 6900, a product of Henkel Adhesives Company, a division of Henkel Corporation, 4620 West 77th Street, Minneapolis, MN is essentially colorless, has a Ball and Ring Softening Point, of 266-302° F.; melt index at 347° F.; percent water absorption, 1 day is 0.2, 7 days is 0.5; tensile yield of 1,200 psi; tensile break of 3,500 psi; and elongation of 540%. The tensile yield, tensile break and elongation are determined at 24° C. according to ASTM Procedure D-1708).

The above polyamide resin coating solution is coated on 0.005 inch (0.127 mm) thick polyethylene terephthalate film using an extrusion die coater to provide a dry film thickness of 0.00017 inch (0.004 mm) on the film, and the dry coated film is wound on wide stock cores.

The photosensitive composition described above is extruded at 160° C. through a die. The extruded composition enters the rotating bank in a two-roll calender and is calendered between two films, one being a 0.005 inch (0.127 mm) flame-treated polyethylene terephthalate support film, and the second being the polyamide-coated polyethylene terephthalate film described above (flame-treated and polyamide sides adjacent to the extruded photosensitive layer). The calender nip can be adjusted to produce photosensitive layers over a wide range of thicknesses, e.g., 0.112 inch (~2.85 mm) thick.

A 6.75×8.25 inches (17.1×21.0 cm) sheet of the photosensitive element having a layer thickness of 0.112 inch (ca. 2.85 mm) is cooled with blown air and is exposed for 80 seconds in air at atmospheric pressure through the support to ultraviolet light from a Cyrel ®3040 Exposure Unit (registered trademark of E. I. du Pont de Nemours and Company) fitted with Sylvania BL-VHO fluorescent lamps. About 0.073 to 0.075 inch (1.81 to 1.91 mm) of the photosensitive layer becomes polymerized.

The polyethylene terephthalate film on the surface of the polyamide layer is stripped therefrom. The polyamide layer remains adhered to the photosensitive layer. The hard, flexible smooth polyamide surface is covered with an image-bearing negative transparency, and following vacuum draw-down the photosensitive layer is imagewise exposed for six minutes in the exposure unit described above.

After exposure, the negative is removed and the exposed element is placed in a rotary drum-brush type Cyrel ®3040 Processor (registered trademark of E. I. du Pont de Nemours and Company). The unpolymerized areas of the element are removed in the processor by washing for 5 minutes with a mixture of 75 volume percent tetrachloroethylene/25 volume percent n-butanol. A printing plate with a relief greater than 0.035 inch (0.89 mm) is prepared. The printing plate is placed flat in a forced hot air dryer or other suitable dryer and is dried at 60° C. for 2 minutes. The brief drying period evaporates some but not all of the solvent from the printing plate making the plate easier to handle.

After removal from the dryer, the surface of the plate is wiped with a methylchloroform dampened cloth in a Cyrel ®3040 Rinse Hood (registered trademark of E. I. du Pont de Nemours and Company). The plate is attached to a 8.5 inch (21.6 cm) circumference steel cylinder (of the same type and dimension used in printing) with plastic coated wire ties and a steel brace as shown in the Figure without affecting or touching the image areas. The plate-cylinder is placed on end in a Cyrel ® Dryer (infrared heat source) for 1 hour at 50°-80° C.

The mounted plate is removed from the dryer, is allowed to cool to room temperature and, after being removed from the cylinder, is detackified for 3 minutes in a solution of aqueous acidic hypochlorite (900 parts water, 90 parts Clorox ®, 10 parts conc. HCl followed by a water rinse. The plate is dried in the Cyrel ®Dryer for 3 minutes to remove moisture from the rinse. After removal from the dryer and reattachment to the cylinder, the plate-cylinder is placed on its side in a high intensity Cyrel ® 3040 Exposure Unit (registered trademark of E. I. du Pont de Nemours and Company) which is fitted with high intensity fluorescent lamps, and the plate is postexposed for 10 minutes. The plate-cylinder is rotated 180° and the other side of the plate is postexposed for 10 minutes.

The plate-cylinder is removed from the exposure unit and the plate is detached from the cylinder. After wiping the support side of the plate with an acetone dampened cloth, the plate is trimmed to 5.63×7.88 inches (14.3×20.0 cm). Resting on a table top, the printing plate stands 2.38 inches (6.05 cm) at the middle of its curl. The flexographic printing plate is useful for printing with standard alcohol-base flexographic inks.

CONTROLS

Control 1

The above procedure is repeated except that after the chlorine treatment and three minute drying, the plate is not remounted on the cylinder but is placed support side down in the high intensity exposure unit described above and is postexposed for 10 minutes. The printing plate is removed from the exposure unit and is trimmed to the plate size described above. Resting on a table top, the control 1 printing plate stands 0.88 inch (2.2 cm) at the middle of its curl.

Control 2

The procedure of Example 1 is repeated except for the following two variations:

(a) rather than being mounted on the cylinder the plate is dried flat for one hour in the dryer with the infrared heat source described above;

(b) after the two minute drying step following the chlorine treatment, the plate is removed and placed in a high intensity exposure unit described above and is postexposed for 10 minutes in a flat position.

The control 2 printing plate is substantially flat with the corners and edges turned slightly inward toward the photopolymerized layer. The slight curl is in the reverse direction of the excellent curl obtained in Example 1.

EXAMPLE 2

A flexographic printing plate 0.112 inch (2.84 mm) in thickness is prepared according to the following procedure:

An adhesive solution is prepared from the following ingredients:

| Ingredient | Amount (parts) |
|---|---|
| Polyamide resin (3), Lot No. OF5237[1] | 63.1 |
| Polyester resin (1),[2] | 27.0 |
| Polyolefin[3] | 9.8 |
| Du Pont Milling Blue BL dye, C.I. Acid Blue 59 | 0.1 |

[1]The polyamide resin, Macromelt ® 6238, a product of Henkel Adhesives Company, a division of Henkel Corp., 4620 West 77th Street, Minneapolis MN is a translucent light amber color, has a Ball and Ring Softening Point of 132-145° C.; melt viscosity of 40 to 60 poises at 210° C.; flash point greater than 299° C.; percent water absorption, 1 day is 0.7, 7 days is 1.6; tensile yield of 460 psi (32.34 kg/cm$^2$); tensile break of 450 psi (31.64 kg/cm$^2$) and elongation of 560%. (The tensile yield, tensile break and elongation are determined at 24° C. according to ASTM Procedure D-1708).
[2]The polyester resin is the reaction product of ethylene glycol, terephthalic acid, isophthalic acid and azelaic acid (molar ratio 6:2:1:3) having a Mn of 19,000 and Mw of 37,000.
[3]The polyolefin, Vestofine ® SF-616, a product of Dura Commodities Corp., 111 Calvert Street, Harrison, New York, is snow white in color, has a molecular weight of about 1,600, a density at 20° C. of about 0.96, penetration hardness at 25° C. of 0.5 to 1.0, a melting point of about 118-128° C., particle size: about 85% 10 microns or below, about 15% 10-20 microns.

The above ingredients are added in order to a 90/10 parts mixture of methylene chloride/Cellosolve ® to give a solution of about 16% solids. The polyolefin beads do not dissolve. The mixture is stirred continuously during and after the addition of the ingredients to effect solution. Any weight loss during mixing is made up by addition of methylene chloride.

The adhesive solution is applied to the flame-treated surface of a polyethylene terephthalate film support, 0.005 inch (~0.13 mm) in thickness using a continuous web coater-dryer to provide a dry coating weight of about 260 mg/dm$^2$. The web speed is 45 feet/minute (~13.72 m/minute) and the drying temperature is 86° C. (187° F.).

The adhesive-coated polyethylene terephthalate support is placed adhesive side up in a steel platen dammed to a thickness of 0.112 inch (2.84 mm), the thickness of the finished printing plate. The adhesive-coated support and platen are placed on a press and an extruded sheet, 0.110 inch (about 2.79 mm) thick, of a photopolymerizable composition on a 0.005 inch (0.13 mm) thick polyethylene terephthalate cover sheet bearing a layer of a polyamide resin having a dry thickness of 0.00017 inch (0.004 mm) is placed thereon with the cover sheet side up, and is covered with a steel plate.

The cover sheet bearing the polyamide layer is prepared by coating the polyethylene terephthalate film with the following solution using an extrusion die coater:

| Ingredient | Amount (%) |
|---|---|
| Methylene chloride | 81.0 |
| Methanol | 2.0 |
| N—methyl pyrrolidone | 10.0 |
| Polyamide resin[1] | 7.0 |

[1]The polyamide resin, Macromelt ® 6900, a product of Henkel Adhesives Company, a division of Henkel Corporation, 4620 West 77th Street, Minneapolis, MN is essentially colorless, has a Ball and Ring Softening Point, of 266-302° F.; melt index at 347° F. of 5-15 g/10 minutes; flash point 570° F., percent water absorption, 1 day is 0.2, 7 days is 0.5; tensile yield of 1,200 psi; tensile break of 3,500 psi; and elongation of 540%. The tensile yield, tensile break and elongation are determined at 24° C. according to ASTM Procedure D-1708).

The extruded sheet of the photopolymerizable composition is prepared from the following ingredients which are blended and the blend is extruded at 170° C. through a die.

| Ingredient | Amount (parts) |
|---|---|
| Acrylonitrile (27)/butadiene (70)/acrylic acid (3), high molecular weight, (average Mooney Viscosity is 45.0, Hycar ® 1472 × 26 B. F. Goodrich Chemical Co. | 81.59 |
| Hexamethylene diacrylate | 10.0 |
| Polyethylenesebacate[4] | 5.0 |
| Dibutyltin-S,S'—bis-isooctyl-mercapto-acetate | 2.0 |
| 2-Phenyl-2,2-dimethoxyacetophenone | 1.25 |
| 2,6-Di-t-butyl-4-methylphenol | 0.10 |
| 1,4,4-Trimethyl-2,3-diazabicyclo-(3.2.2)-non-2-ene-2,3-dioxide | 0.05 |
| Du Pont Milling Blue BL dye, C.I. Acid Blue 59 (10% dispersion in ethylene glycol) | 0.01 (dry) |

[4]Paraplex ® G-30, a low molecular weight polyester resin manufactured by Rohm and Haas, Philadelphia, PA.

The plate formed is removed from the press, cut to 6.75×7.25 inch (17.1×18.4 cm) size and is placed support side up in the exposure unit described in Example 1. The element is given an overall exposure in air at atmospheric pressure for 3 minutes through the support to polymerize a 0.065 inch (1.65 mm) thickness of the photopolymerizable layer adjacent the adhered support.

After removal of the cover sheet, the element is then placed polyamide resin layer side up in the exposure unit (descrebed in Example 1). An image-bearing transparency (negative) is place on the element surface, and the element is exposed for 24 minutes while under vacuum.

After exposure the transparency is removed, and the exposed element is placed in the rotary drum-brush processor described in Example 1. The unpolymerized areas of the element and the entire polyamide resin layer are removed in the processor by washing for 17 minutes with a mixture of perchloroethylene (75 vol. %)/n-butanol (25 vol. %) solvent. A greater than 0.045 inch (0.14 mm) relief image is obtained. The developed element (printing plate) is placed flat in a forced hot air dryer or other suitable dryer and is dried at 60° C. for 2 minutes. This brief drying period is not sufficient to dry the plate completely but makes it easier to handle.

The plate is attached to a 7.5 inch (1.91 cm) circumference polyvinyl chloride cylinder as shown in the Figure and the plate-cylinder is placed on end in the infrared dryer as described in Example 1 for 1 hour at 50°–80° C. The mounted plate, after cooling to room temperature, is removed from the cylinder and placed for 3 minutes in a chlorine finishing solution, half strength of that described in Example 1, followed by a water rinse. The plate is dried briefly in the dryer with the infrared heat source as described in Example 1. After removal from the dryer and reattachment to the cylinder, the plate-cylinder is placed on its side in the high intensity exposure unit described in Example 1 and is postexposed for 10 minutes on one side and then for 10 minutes on the other side. The postexposed plate is removed from the exposure unit, detached from the cylinder, and is trimmed to a size of 7.25×5.5 inches (18.4×14.0 cm). Resting on a table top, the printing plate stands 2.63 inches (6.68 cm) at the middle of its curl. The flexographic printing plate is useful for printing with standard hydrocarbon-based inks.

EXAMPLE 3

Example 2 is repeated through the two minute drying period at 60° C., and the plate is then placed flat in the dryer with the infrared heat source as described in Example 1 for 1 hour at 50°–80° C. The plate is removed from the dryer, is allowed to cool to room temperature and is finished in the chlorine solution as described in Example 2 followed by a water rinse. The plate is dried briefly in the dryer with the infrared heat source as described in Example 1. After removal from the dryer, the plate is reattached to the cylinder, the plate-cylinder is placed on its side in the exposure unit and is postexposed as described in Example 1. The postexposed plate is removed from the exposure unit, detached from the cylinder and is trimmed to a size of 7.25×5.5 inches (18.4×14.0 cm). Resting on a table top, the printing plate stands 2.38 inches (6.0 cm) at the middle of its curl. A useful flexographic printing plate is obtained.

EXAMPLE 4

A 9×11.5 inch (2.29×29.2 cm) sheet of a photosensitive element having a photopolymerizable layer thickness of 0.250 inch (6.35 mm) prepared by the procedure described in Example 1 is exposed through its polyethylene terephthalate support for 150 seconds as described in Example 1 yielding a polymerized thickness in the layer of 0.129–0.130 inch (3.28–3.30 mm). The photopolymerizable layer is then imagewise exposed as described in Example 1 for eight minutes followed by removal of the unpolymerized areas of the element by washing for 15 minutes as described in Example 1. A printing plate with a relief of about 0.120 inch (3.05 mm) is obtained. After drying for 5 minutes at 60° C. in a forced hot air dryer as described in Example 1, the plate is removed from the dryer and the surface is wiped with a methylchloroform dampened cloth as described in Example 1. The plate is attached to a 12 inch (3.05 cm) circumference cardboard cylinder as described in Example 1, and the plate-cylinder is placed on end in the dryer with the infrared heat source described in that example. After heating for 1 hour at 50°–80° C., the mounted plate is removed from the dryer and the plate is allowed to cool to room temperature. After being removed from the cylinder, the plate is finished in the chlorine solution as described in Example 1 followed by a water rinse. The plate is dried in a forced hot air dryer at 60° C. for 5 minutes to evaporate moisture remaining from the rinse step. The plate is removed from the dryer, reattached to the cylinder as shown in the Figure and the plate is postexposed for a total of 20 minutes (10 minutes on each side) as described in Example 1. After removal of the plate-cylinder from the exposure unit, the plate is removed from the cylinder and is trimmed to 8.25×10.5 inches (21.0×26.7 cm) in size. Resting on a table top, the printing plate stands 1.38 inches (3.51 cm) at the middle of its curl.

EXAMPLE 5

Three trimmed printing plates, 7.25×5.63 inches, (18.4×14.3 cm) are prepared as follows: Plate A is the precurled plate prepared as described in Example 1.

Plate B is the Control 1 plate prepared as described in Example 1.

Plate C is the Control 2 plate prepared as described in Example 1. Each of the three plates is attached to a 7.5 inches (19.1 cm) circumference polyvinyl chloride cylinder by means of a weak adhesive (sticky back masking tape, 3M Company). Plate A readily assumes a cylindrical shape and is held to the cylinder by the adhesive layer. Plate B less readily assumes a cylindrical shape and requires wire ties as shown in the Figure to retain it on the cylinder. Plate C resists being curled onto the cylinder and readily pulls away from the cylinder. Wire ties and a brace, both as shown in the Figure, are required to keep Plate C on the cylinder.

The Plates A, B and C are given an ozone test. Mounted plates are preferred for the test since the stress conditions are similar to those of a printing plate mounted on a press roll. The three mounted plates are placed in an ozone chamber. After 1 hour the plates have the following appearance:

Plate A: Very few cracks
Plate B: Some cracks
Plate C: Many cracks
After 3 hours the plates had the following appearance:
Plate A: Few cracks on top of relief areas and in reverse areas
Plate B: Intermediate number of cracks on top of relief areas and in reverse areas
Plate C: Many cracks on top of high relief areas and in reverse areas
Plate A of this invention exhibits a better appearance than the controls, Plates B and C.

EXAMPLE 6

Two trimmed printing plates, 7.25×5.63 inches, (18.4×14.3 cm) are prepared as follows: Plate A is the precurled plate prepared as described in Example 1.

Plate B is Control 2 plate prepared as described in Example 1. Each of the plates is attached to a 7.5 inches (19.1 cm) circumference stainless steel cylinder (ca. 1.5 lbs in weight) by means of a 0.002 inch (0.05 mm) clear, high tack adhesive transfer tape (Product No. 465) manufactured by 3M Co., St. Paul, Minn. The adhesive readily holds the plates to the cylinders. The two cylinders are placed on a rolling mill consisting of round parallel bars rotated by an electric motor. Both cylinders are rolled at the same speed. After 3.5 hours on the mill, Plate B begins to pull away from its cylinder at the ends. Plate A shows no delamination. After 9.5 hours on the mill, both ends of Plate B have pulled away from the cylinder about 0.44 inch (11.2 mm). Plate A has negligible delamination after 9.5 hours on the mill.

EXAMPLE 7

The procedure of Example 1 is repeated through the point where the slightly dried plate is wiped with a methylchloroform dampened cloth. The plate is dried flat for one hour in the dryer with the infrared heat source described in Example 1. The plate is removed from the dryer, is permitted to cool while resting on a table top and is finished by the chlorine solution as described in Example 1. The finished plate is dried for 3 minutes as described in Example 1, is attached to the cylinder as described in that Example, and is postexposed also as described in Example 1.

The postexposed plate-cylinder is removed from the exposure unit, and the plate is detached from the cylinder. The back side is wiped with an acetone dampened towel and the plate is trimmed to the size of 5.63×7.88 inches (14.3×20.0 cm). The printing plate possesses a permanent curl toward its polyethylene terephthalate support side and is readily wrapped around a printing cylinder.

EXAMPLE 8

A 6.75×8.25 inches (17.1×21.0 cm) sheet of the photosensitive element described in Example 1 is exposed through the support, exposed and developed in the processor as described in Example 1. The printing plate is removed from the processor and is attached to a 8.5 inches (21.6 cm) circumference steel cylinder with plastic coated wire ties and a steel brace as shown in the Figure. The printing plate is placed in the dryer with the infrared heat source described in Example 1 for 5 minutes at 50°–80° C. The printing plate is then removed from the oven and while attached to the cylinder the surface of the plate is wiped with a methylchloroform dampened cloth. The printing plate is immediately returned to the dryer with the infrared heat source for 1 hour to complete the drying. The printing plate upon removal from the dryer, detachment from the cylinder and cooling to room temperature is treated in the solution of aqueous acidic hypochlorite as described in Example 1. The plate is reattached to the cylinder and is placed in the dryer described above for 5 minutes to remove water remaining on the surface. The printing plate is removed from the dryer, is placed in the high intensity exposure unit described in Example 1 and is postexposed for a total of 20 minutes (10 minutes on each side) as described in Example 1. The printing plate-cylinder is removed from the exposure unit and the plate is detached from the cylinder. The printing plate is trimmed to a size of 5.63×7.88 inches (14.3×20.0 cm). Resting on a table top, the printing plate stands 2.81 inches (7.14 cm) at the middle of its curl. The flexographic printing plate is useful for printing with standard alcohol-base flexographic inks.

We claim:

1. A process for providing a permanent curl in a flexographic printing plate having solvent-insoluble, elastomeric printing reliefs prepared by liquid development, the printing plate comprising a flexible sheet support, and a photopolymerized layer of a photosensitive, elastomeric composition having a dry thickness of about 0.005 inch to about 0.250 inch, the process comprising, after liquid development, the printing plate is dried at a temperature in the range of about 20° to 80° C. for 0.25 hour to 24 hours and is postexposed by overall exposing the dry printing relief to a source of actinic radiation for 1 to 30 minutes, at least the postexposure occurring while the printing plate is present on a curver cylinder surface from which is is capable of being detached.

2. A process for providing a permanent curl in a flexographic printing plate having solvent-insoluble, elastomeric printing reliefs prepared by liquid development, the printing plate comprising a flexible sheet support, and a photopolymerized layer of a photosensitive, elastomeric composition having a dry thickness of about 0.005 inch to about 0.250 inch, the process comprising, after liquid development, the printing plate is dried at a temperature in the range of about 20° to 80° C. for 0.25 hour to 24 hours and is postexposed by overall exposing the dry printing relief to a source of actinic radiation for 1 to 30 minutes, the printing plate is present on a curved cylinder surface during drying and postexposure and is capable of being detached from the curved cylinder surface.

3. A process according to claim 1 or claim 2 wherein the photosensitive, elastomeric composition comprises a polymer of a conjugated diolefin hydrocarbon, a nongaseous ethylenically unsaturated compound containing at least one terminal ethylenic group and an organic, radiation-sensitive, free radical generating compound or system, activatable by actinic radiation which initiates polymerization of the unsaturated compound.

4. A process according to claim 3 wherein the conjugated diolefin hydrocarbon polymer is a polymer selected from butadiene/acrylonitrile, butadiene/acrylonitrile/acrylic acid, butadiene/styrene, styrene-butadiene-styrene block copolymer, and styrene-isoprene-styrene block copolymer.

5. A process according to claim 3 wherein the elastomeric composition comprises, based on the total weight of the composition
   (1) 55 to 90% by weight of a high molecular weight butadiene/acrylonitrile copolymer having a number average molecular weight of 20,000 to 75,000, an acrylonitrile content of a 10 to 50% by weight and a carboxyl content of 0 to 15% by weight,
   (2) 2 to 40% by weight of a nongaseous, ethylenically unsaturated compound containing at least one terminal ethylenic group, said compound being capable of forming a high polymer by free-radical initiated, chain-propagating addition polymerization and being compatible with polymer (a);
   (3) 0.001 to 10% by weight of an organic, radiation-sensitive, free-radical generating system, activatable by actinic radiation which initiates polymerization of the unsaturated compound; and (4) 0 to 15% by weight of a compatible plasticizer.

6. A process according to claim 3 wherein the elastomeric composition comprises, based on the total weight of composition (1) at least 30% by weight of at least one solvent-soluble, thermoplastic, elastomeric block copolymer containing at least two thermoplastic, nonelastomeric polymer blocks having a glass transition temperature above 25° C. and a number average molecular weight of 2000–100,000, and between said thermoplastic, nonelastomeric polymer blocks an elastomeric polymer block having a glass transition temperature below 10° C. and a number average molecular weight of about 25,000 to 1,000,000.

(2) at least 1% by weight of an addition-polymerizable ethylenically unsaturated compound containing at least one terminal ethylenic group, and (3) a polymerization-effective amount of polymerization initiator activatable by actinic radiation.

7. A process according to claim 6 wherein one thermoplastic, nonelastomeric polymer block has a glass transition temperature between −30° C. and +25° C.

8. A process for providing a permanent curl in a flexographic printing plate having solvent-insoluble, elastomeric printing reliefs prepared by accomplishing the imagewise exposure while the plate is flat followed by liquid development, the printing plate comprising a flexible sheet support, and a photopolymerized layer of a photosensitive, elastomeric composition having a dry thickness of about 0.005 inch to about 0.250 inch, the process comprising, after liquid development, the printing plate is dried at a temperature in the range of about 20° to 80° C. for 0.25 hour to 24 hours and is postexposed by overall exposing the dry printing relief to a source of actinic radiation for 1 to 30 minutes, at least the postexposure occurring while the printing plate is present on a curved cylinder surface from which it is capable of being detached.

* * * * *